United States Patent [19]

Hashemi et al.

[11] Patent Number: 4,853,898
[45] Date of Patent: Aug. 1, 1989

[54] BIPOLAR RAM HAVING STATE DEPENDENT WRITE CURRENT

[75] Inventors: A. David Hashemi, Santa Clara; Robert M. Reinschmidt, Losgatos, both of Calif.

[73] Assignee: Digital Equipment Corporation, Maynard, Mass.

[21] Appl. No.: 155,021

[22] Filed: Feb. 11, 1988

[51] Int. Cl.⁴ ............................................... G11C 7/00
[52] U.S. Cl. ............................ 365/189.11; 365/155; 365/190
[58] Field of Search ............... 365/155, 179, 189, 203, 365/230, 190

[56] References Cited

U.S. PATENT DOCUMENTS 4,314,359  2/1982  Kato et al. ........................... 365/179
4,742,488  5/1988  Wong .................................... 365/189

Primary Examiner—Joseph A. Popek
Attorney, Agent, or Firm—Finnegan, Henderson, Farabow, Garrett & Dunner

[57] ABSTRACT

A bipolar RAM having improved read and write cycle times. During a write operation, the state of a selected memory cell is sensed by read/write current controller circuits. A high write current is selected if the data to be written requires a shift of the memory state of the memory cell, and a low write current is selected if the data to be written corresponds to the present memory state of the memory cell. This improves the write cycle time by reducing saturation of the memory cell. If a long write signal is impressed on the RAM, the read/write current controller circuit terminates the high level write current after the memory cell has shifted its memory state. When a memory cell is being selected for a read or write operation, the write current select circuit discharges the bit line attached to the low voltage side of the selected memory cell, improving the read cycle time.

12 Claims, 4 Drawing Sheets

BIPOLAR RAM HAVING STATE DEPENDENT WRITE CURRENT

BACKGROUND OF THE INVENTION

I. Field of the Invention

This invention relates to bipolar random access memories and in particular to circuits for writing to a selected memory cell.

II. Background Information

Bipolar Random Access Memories (bipolar RAMs) are devices implemented in bipolar technology which store and recall information in binary form. The information can be stored or recalled in any order at the user's discretion (at random). Although conventional bipolar RAMs are widely used throughout the computer industry, the speed of operation is unacceptably slow for certain applications. This speed problem can be better appreciated through an understanding of the operation of a conventional bipolar RAM.

The basic element for data storage in a bipolar RAM is a memory cell, which is a bi-stable latch. Memory cells are physically placed in a rectangular array and connected by pairs of metal conductors called word lines and bit lines. A particular memory cell in the array is selected for data retrieval (a read operation) or data storage (a write operation) by selecting one particular pair of word lines and one particular pair of bit lines. FIG. 1 shows a conventional bipolar RAM 10 which contains one memory cell 12. Memory cell 12 comprises two cross-coupled silicon controlled rectifiers (SCRs). An SCR is shown schematically as a PNP transistor and a dual emitter NPN transistor connected such that the base of the PNP is connected to the collector of the NPN and the base of the NPN is connected to the collector of the PNP. By cross-coupling the two SCRs (connecting the NPN collector and base nodes of one SCR correspondingly to the base and collector nodes of the other SCR) a bi-stable latch is constructed. The two stable states are represented by either one SCR or the other SCR conducting current. Memory cell 12 has 4 external terminals and two internal nodes. The PNP emitters are connected together and to upper word line 18. Two NPN emitters from different SCRs are connected together and to lower word line 19. Two NPN emitters, one from each SCR are each connected to a bit line which together form a bit line pair 14 and 15. The internal memory cell nodes are nodes 16 and 17. Node 16 connects the base of NPN transistor 36 to the base of PNP transistor 29 and node 17 connects the base of NPN transistor 31 to the base of PNP transistor 34.

Upper word line 18 is driven by an emitter follower (not shown). Connected to the lower word line 19 is a constant current sink which supplies current to memory cell 12 to maintain the bi-stable state of memory cell 12 when not selected. Memory cell 12 is selected by forcing high voltage on upper word line 18 (selecting the row) and simultaneously turning on switchable current sinks 38 and 39 (selecting the bit line). When cell 12 is selected, read or write operations can be performed on memory cell 12.

Referring to memory cell 12, a "1" state can be defined when the voltage at node 17 is high and the voltage at node 16 is low. Correspondingly a "0" state is when the voltage at node 16 is high and the voltage at node 17 is low. During a read operation, memory cell 12 is selected and signals RD and $\overline{RD}$ are set to a read threshold voltage which is designed to be a voltage approximately midway between the voltages at the internal nodes 16 and 17 of the selected cell. In the read mode, if memory cell 12 is in the "1" state, node 17 is high (higher than $\overline{RD}$) and the right side of the memory cell 12 conducts current to current sink 39. Transistor 25 is off. Node 16 is low (lower than RD) and the left side of the memory cell 12 is off. Transistor 24 conducts current to current sink 38. Since transistor 25 is off, only "keep alive" current is flowing through transistor 27.

Transistor 24 is on and its collector current plus a keep alive current is flowing through transistor 26. Transistor 26 is conducting more current than transistor 27 which creates a voltage difference at the collector nodes of transistors 26 and 27. This voltage difference indicates the state of selected memory cell 12 and is amplified and transmitted to the output to produce a logic "1" level corresponding to the state of selected memory cell 12. In a similar manner when the selected memory cell contains a "0" state, the corresponding logic "0" state will be transmitted to the output.

A write operation results in selected memory cell 12 being in a particular state corresponding to the data input. If selected memory cell 12, before writing, is in the opposite state of the input data, its state will be altered to correspond to the input data. If the state of selected memory cell 12, before writing, is already in the same state as the input data, its state will not be altered.

Referring to FIG. 1, a write "1" operation will be explained. Before a write operation, circuit 10 is in a read mode. In this mode both RD and $\overline{RD}$ are set to a read threshold voltage. To write a "1" to selected memory cell 12, voltage $\overline{RD}$ is lowered until its voltage is lower than the lowest of the two internal nodes 16 and 17. If node 17 is low (corresponding to "0" state) before the write operation, the right side of memory cell 12 will be off. When $\overline{RD}$ voltage is lowered, the voltage at bit line 15 will drop until memory cell 12 bit line emitter begins to conduct current to sink 39. This will cause the right side of memory cell 12 to turn on which will turn off the left side. In this manner the state of memory cell 12 is altered. When the voltage at node 16 is lower than the voltage at node 17 by sufficient margin, the write operation can be terminated and memory cell 12 will in time recover to the full differential voltage corresponding to the altered stable binary state. The write operation is terminated by raising voltage $\overline{RD}$ back to the read threshold voltage.

Write recovery time is defined as the time delay between the termination of the write signal, $\overline{RD}$ in this example, and the appearance of stable correct data at the output buffer. If memory cell 12 has not recovered such that node 17 voltage is higher than the read threshold voltage when the write operation is terminated, memory cell 12 will exhibit extended write recovery time. In this case two things will happen. First, when voltage $\overline{RD}$ is raised, the parasitic capacitance of bit line 15 will be charged through transistor 25 which will cause a transient current to flow through transistor 27 and to sense amplifier 22 that corresponds to the opposite state of the data written. Second, when voltage $\overline{RD}$ reaches the read threshold voltage, since the voltage at node 17 is still lower than the read threshold, transistor 25 will continue to conduct the current from current sink 39. In this case both transistors 24 and 25 are conducting and the voltage differential at sense amplifier 22 is small with an indeterminate polarity. Until memory cell 12 recovers (node 17 is higher than the read threshold) a correct stable state will not appear at the output. Once memory cell 12 recovers, the correct data will propagate to the output. In this manner the write recovery time will be a function of the time duration of the write pulse width in relation to the speed of writing into memory cell 12 including the speed of recovering to a readable level.

Memory cells which have slow writing characteristics such as the cross coupled SCR cell are frequently used because of their higher immunity to noise such as current transients caused by alpha particles. Although these cell exhibit reduced soft error rate they have the characteristic of longer write time and longer write recovery time.

It is therefore desirable to reduce write times for memory cells having slow write characteristics resulting from current dependent diffusion capacitance.

SUMMARY OF THE INVENTION

Objects and advantages of the invention will be set forth in the description which follows, and in part will be obvious from the description, or may be learned by practice of the invention.

To achieve the foregoing objects, and in accordance with the purposes of the invention as embodied and broadly described herein, a bipolar random access memory is provided comprising at least one pair of bit lines; at least one memory cell connected between the pair of bit lines, with each memory cell having a first memory state representing a first data value and a second memory state representing a second data value; means for selecting the at least one memory cell for a read operation or a write operation; means for writing data values to the at least one memory cell by shifting the present memory state using a first write current of a first magnitude when the data value does not correspond to the memory state, and by not shifting the memory state using a second, lower magnitude, write current when the data value corresponds to the present memory state.

BRIEF DESCRIPTION OF THE DRAWINGS

The accompanying drawings, which are incorporated in and constitute a part of the specification, illustrate a preferred embodiment of the invention and, together with the general description given above and the detailed description of the preferred embodiment given below, serve to explain the principles of the invention.

DESCRIPTION OF THE PREFERRED EMBODIMENT

Reference will now be made in detail to the present preferred embodiments of the invention as illustrated in the accompanying drawings.

Figure 1:
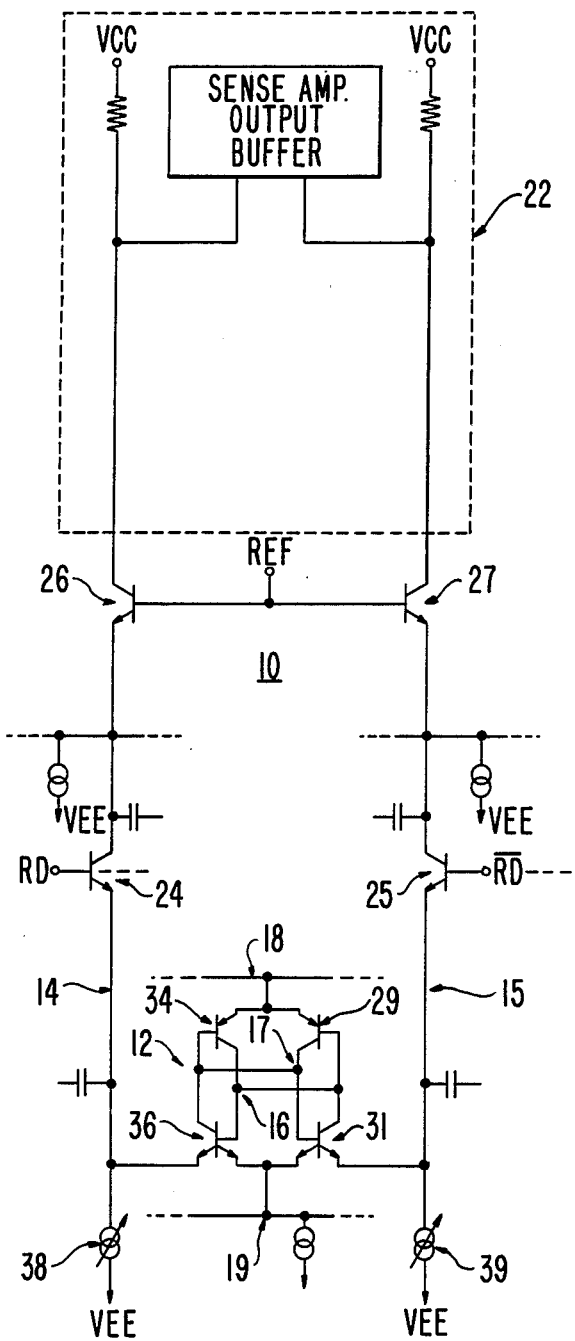
FIG. 1 is a circuit diagram of a conventional random access memory employing bipolar memory cells.
Figure 2:
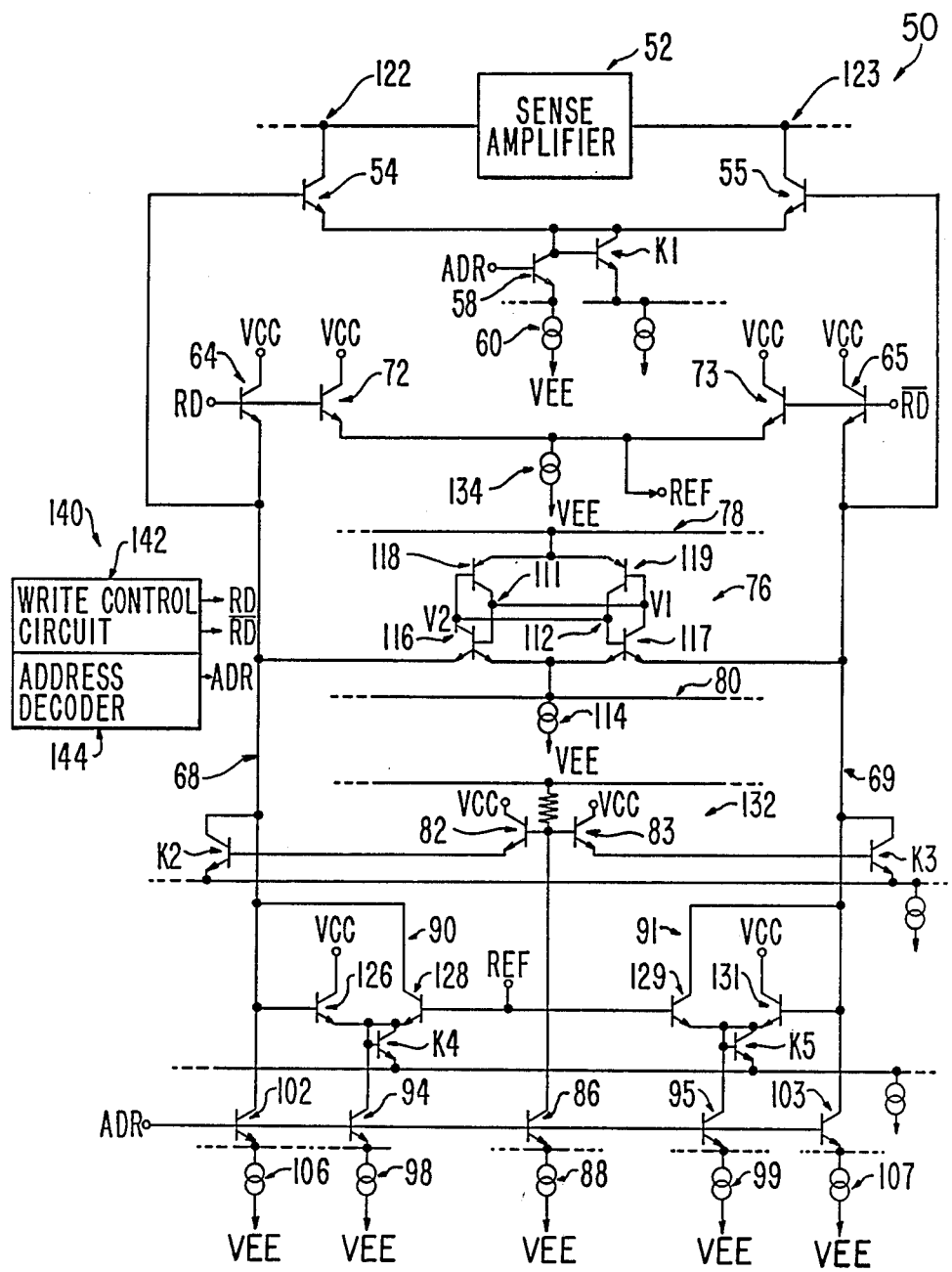
FIG. 2 is a circuit diagram of a first embodiment of the invention in which a random access memory includes read/write current controller circuits.

A bipolar random access memory circuit 50 having read/write current controller circuits is shown in FIG. 2 and comprises a sense amplifier 52, voltage sensing transistors 54 and 55, read/write transistors 64 and 65, bit lines 68 and 69, reference voltage REF supply transistors, 72 and 73, bipolar memory cell 76, bit line deselect charging transistors 82 and 83, and read/write current controller circuits 90 and 91. Sense amplifier 52 is connected by voltage sensing transistors 54 and 55 to bit lines 68 and 69. Read/write transistors 64 and 65 are also connected to bit lines 68 and 69. Connected to the bases of read/write transistors 64 and 65 are reference voltage supply transistors 72 and 73. Bipolar memory cell 76 is connected to each bit line 68 and 69, upper word line 78, and lower word line 80. Read/write current controller circuits, represented generally by the numerals 90 and 91, connect to respective bit lines 68 and 69, reference voltage source REF, and to write current sinks 98 and 99 through the collector-emitter paths of respective bit line select transistors 94 and 95. Bit lines 68 and 69 are connected to bit line select transistors 102 and 103 which are in turn connected to current sinks 106 and 107.

The RAM of the invention may incorporate a conventional sense amplifier, but the embodiments of the sense amplifiers disclosed in copending U.S. Patent Application, Ser. No. 155,022, filed on Feb. 11, 1988, by A. David Hashemi and Robert M. Reinschmidt, entitled "Bipolar Ram Circuit Having No Write Recovery Time" (DEC-212 ) and assigned to the assignee of the present invention, constitute the preferred embodiments of the same amplifier. The contents of this copending application are expressly incorporated herein by reference. The RAM of FIGS. 2 and 4 and the examples presented herein address only the voltage sensing type of sense amplifier; however, both voltage sensing and current sensing embodiments of sense amplifiers operate equally well with the RAM of the present invention.

A bipolar random access memory may, for example, comprise 4 sense amplifiers, each connected to 16 pairs of bit lines, and each pair of bit lines having 64 connected memory cells. The description which follows will be limited to the operation of only one sense amplifier with one pair of bit lines and one memory cell; however, this description is directly applicable to a random access memory having a plurality of sense amplifiers, bit lines, and memory cells.

Memory cell 76 of FIG. 2 comprises transistors 116, 118, 117 and 119. The collectors of transistors 117 and 118 are connected to the bases of transistors 116 and 119 at node 111. The collectors of transistors 116 and 119 are connected to the base of transistors 117 and 118 at node 112. In operation, memory cell 76 maintains itself in one of two states, with either the voltage (V1) at node 111 high and the voltage (V2) at node 112 low, or V1 low and V2 high. Current sink 114 provides a holding current to keep memory cell 76 in its present memory state. When selected by upper word line 78 going high, and an ADR voltage signal provided by address decoder 144, part of conventional input circuits 140, being applied to the bases of transistors 58, 86, 94, 95, 102 and 103 going high, memory cell 76 charges one bit line as is appropriate to the memory state of memory cell 76.

Transistors K1-K5 are "keep alive" transistors connected as diodes between the emitters of various transistors and "keep alive" current sinks. Keep alive transistors K1-K5 prevent the emitters of connected transistors from charging when the emitters are not coupled to current sinks, generally when the bit line pair is not selected.

Turning now to the operation of RAM 50, to read memory cell 76, memory cell 76 must first be selected by taking upper word line 78 and ADR high. ADR going high turns on transistors 58, 86, 94, 95, 102 and 103 to conduct currents from sinks 60, 88, 98, 99, 106 and 107, respectively. Current sinks 106 and 107 provide a "read" current of a low value to bit lines 68 and 69.

Assuming that selected memory cell 76 is in an equilibrium memory state where voltage V1 at node 111 is high and voltage V2 at node 112 is low, transistors 116 and 118 are on, raising the voltage of bit line 68. Transistors 117 and 119 are off and current to sink 107 is provided by transistor 65. Transistors 116 and 117 are shown with two emitters from a single transistor. This represents two transistors connected with common bases and common collectors. RD and $\overline{RD}$ at the bases of read/write transistors 64 and 65 are set to a voltage intermediate between V1 and V2, as shown by point 200 on the line representing RD and $\overline{RD}$ of FIG. 3. Setting RD and $\overline{RD}$ at this intermediate voltage turns off transistor 64 and turns on transistor 65, turning on transistor 54, and turning off transistor 55. Differential current at sense amplifier 52 input nodes 122 and 123 reflects the state of memory cell 76.

When voltage one bit line 69 is low, transistors 129 and 131 are on, therefore the current of sink 99 is shared by transistors 129 and 131. This raises bit line read currents, providing faster read times.

RAM 50 functions is a similar manner when selected memory cell 76 is in the second memory state (i.e., V1 is low and V2 is high).

During a write operation to memory cell 76, the RAM of the present invention uses a low level write current when the memory state of memory cell 76 corresponds to the data to be written to memory cell 76. A high level write current is used when the memory state of memory cell 76 does not correspond to the data to be written, i.e., the write operation will shift the memory state of memory cell 76. Separate read and low level write current sinks may also be used to implement the present invention. In general the write time of memory cell 76 improves as the ratio of the low level write current (which is also the read current) to the high level write current becomes smaller. There is an optimum ratio which is a function of the semiconductor process characteristics. The high level write current is, however, limited by the point at which the performance of memory cell 76 transistors degrades. Low level read current is limited by the point at which read access time degrades.

In the preferred embodiment of the invention shown in FIG. 2, read/write current controller circuit 90 is shown by way of example and not limitation as comprising transistors 94, 126, and 128, and current source 98. Read/write current controller circuit 91 connected to bit line 69 comprises transistors 95, 129, and 131, and current source 99.

For a first example of a write operation, assume that V1 at node 111 is high and V2 at node 112 is low. Also assume that the data to be written into memory cell 76 does not correspond to the data already stored in memory cell 76 and will, therefore, require a shift of the memory state. Prior to the write operation, memory cell 76 is selected by taking upper word line 78 high and setting ADR high. This turns on all the bit line select transistors 58, 86, 94, 95, 102 and 103 having bases connected to signal ADR. Bit line 69 now begins discharging through low level current sink 107. Next, $\overline{RD}$ is taken low by write control circuit 142, shown by point 202 on the line representing $\overline{RD}$ of FIG. 3, turning off transistor 65. The voltage on bit line 69 drops. When bit line 69 voltage is less than the reference voltage REF, transistor 131 turns off and transistor 139 conducts all current of sink 99, discharging bit line 69 through high level current sink 99 in addition to current sink 107, thereby writing with a high level current. The write current turns on transistor 117 in memory cell 76, lowering V1 at node 111 and shutting off transistor 116. As PNP transistor 119 slowly turns on and transistor 118 slowly turns off, V2 approaches its equilibrium value, point 208 on the line representing V2 of FIG. 3. At point 202 on the line representing $\overline{RD}$ of FIG. 3, when $\overline{RD}$ drops, RD remains high, but less than V1. As transistor 116 turns off, bit line 68 discharges through low level current sink 106. When V1 drops below RD, transistor 64 turns on, and bit line 68 voltage is approximately equal to REF, therefore transistors 126 and 128 share the current from sink 98.

After voltage V1 has dropped and V2 has started to rise, memory cell 76 has been shifted to a new memory state. $\overline{RD}$ is brought back, at point 204 on the line representing $\overline{RD}$ of FIG. 4, to a voltage midway between V1 and the final state of V2.

If the write signal is a long write signal, that is, $\overline{RD}$ in the example is raised to its normal read level after voltage V2 exceeds the $\overline{RD}$ read voltage level, read/write current controller circuit 91 terminates the write current to memory cell 76. This is done as follows: as V2 rises, voltage on bit line 69 rises. When bit line 69 voltage exceeds REF, transistor 139 turns off and transistor 131 turns on, supplying current sink 99 and terminating the high level write current through memory cell 76. This prevents memory cell 76 from being driven into deep saturation.

If memory cell 76 is already in the memory state corresponding to the data to be written, for example, V2 will be high and V1 will be low at the beginning of the data write operation. Bit line 69 will be at a high voltage when memory cell 76 is selected, therefore when $\overline{RD}$ goes low, bit line 69 remains high because of the current through memory cell 76. Transistor 131 remains on, and high level current sink 99 is fed from a source of high voltage, VCC, through transistor 131. Transistor 129 remains off, therefore memory cell 76 feeds only low level write current sink, 107. This low write current prevents forcing memory cell 76 into deep saturation, as would happen if a high level write current were used.

A bit line deselect charging circuit may be used to charge the bit lines to a preselected voltage level following deselection after a read or write operation. In the first preferred embodiment, bit line deselect charging circuit 132 is shown in FIG. 2 by way of example and not as a limitation as comprising bit line deselect charging transistors 82 and 83, bit line select transistor 86, and current sink 88.

If signal ADR goes low following a read or write operation, transistors 82 and 83 turn on, charging the bit lines to a predetermined level rather than letting them float.

Figure 4:
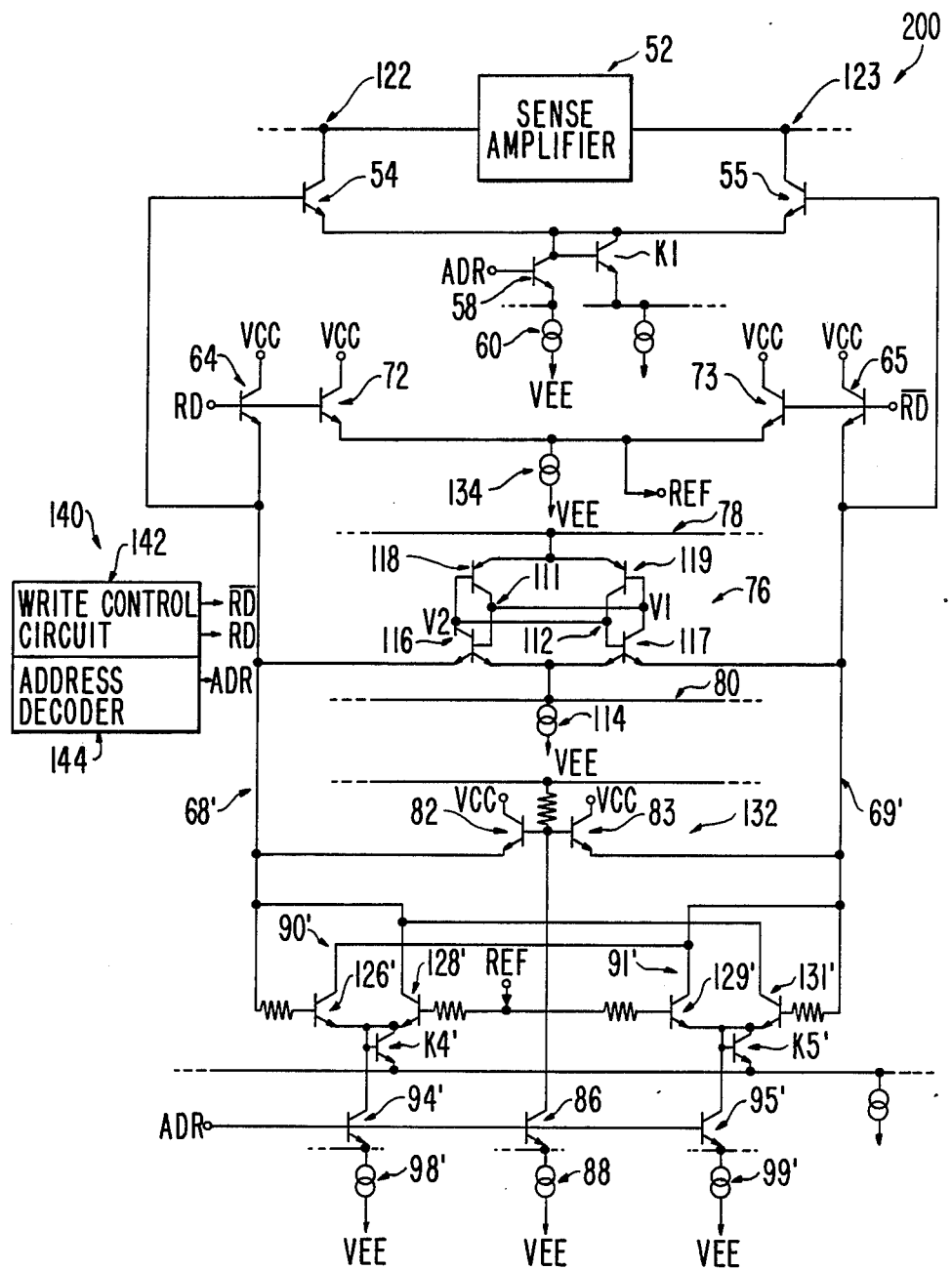
FIG. 4 is a circuit diagram of a second embodiment of the invention in which a random access memory includes read/write current controller circuits.

A second preferred embodiment of a bipolar RAM 200 having the read/write current controller circuits of the invention is shown in FIG. 4. RAM 200 is similar to RAM 50 but has the following differences. In the second preferred embodiment, the collectors of transistors 126' and 131' are cross connected to the opposite side bit lines 69' and 68', respectively. Bit lines 68' and 69' terminate at the bases of transistors 126' and 131', respectively. Resistors are placed between the base of transistor 126' and bit line 68' and between the base of transistor 131' and bit line 69' to limit base currents during saturation. Resistors are placed between the bases of transistors 128' and REF and 129' and REF for the purpose of matching voltage drops.

Transistors K1, K4' and K5' are "keep alive" transistors connected as diodes between the emitters of various transistors and "keep alive" current sinks. Keep alive transistors K1, K4', and K5' prevent the emitters of connected transistors from charging when the emitters are not coupled to current sinks, generally when the bit line pair is not selected.

As discussed above, the read current is also the low level write current. In general, as read current is increased, memory cell 76 read cycle time decreases, but as the ratio of low level write current (i.e., read current) to high level write current increases, the ratio of diffusion capacitance to write current of memory cell 76 increases, slowing down the write cycle time of RAM 200. The circuits of the second preferred embodiment increases the effective read current by rapidly discharging the low voltage bit line during a read operation, but does not increase the low level write current. The read cycle time therefore drops without increasing the write cycle time.

Assume that memory cell 76 of FIG. 4 has been selected in the manner described above, and that V2 at node 112 is high and V1 at node 111 is low. When selected, memory cell 76 must charge bit line 69' and bit line 68' must be discharged prior to sense amplifier 52 being able to read the memory state of memory cell 76. The charging of bit line 69' by the high side of memory cell 76 takes place relatively rapidly, but the discharging of bit line 68' attached to the low side of memory cell 76 occurs more slowly.

In accordance with the invention, read/write current controller circuits 90' and 91' discharge the bit line coupled to the low voltage side of selected memory cell 76. In the second preferred embodiment, read/write current controller circuits 90' and 91' are shown to comprise transistors 126', 128', 129', 131', 94', and 95', and high level write current sinks 98' and 99'. When transistor 129' is off and transistor 131' is on, high level current sink 99' is supplied from bit line 68' through transistor 131', rapidly discharging bit line 68' which is attached to the low level side of memory cell 76.

In the second preferred embodiment, current sink 134' is sized so that reference voltage level REF is slightly higher than the bit line voltage when the associated bit line read/write transistor is conducting. The current through transistor 128' will therefore exceed the current through transistor 126', thereby supplying most of current sink 98' from the low level bit line 68'. This reduces the current drained from the high voltage side of memory cell 76 connected to bit line 69'.

Following the charging of high level bit line 69' and the discharging of low level bit line 68', sense amplifier 52 reads the state of memory cell 76 in the same manner as described for the first preferred embodiment. The voltage difference between low voltage level bit line 68' and high level bit line 69' turns off transistor 54 and turns on transistor 55 supplying a differential current to sense amplifier 52 which corresponds to the memory state of memory cell 76.

For a second example of a write operation, assume that V1 at node 111 is high and V2 at node 112 is low. Also assume that the data to be written to memory cell 76 is opposite to the data already stored in (i.e., the memory state of) memory cell 76 and will therefore require a shift of the memory state of memory cell 76. Before the write operation begins, memory cell 76 is selected as described above. Next, $\overline{RD}$ is taken low at point 202 on the line representing $\overline{RD}$ of FIG. 3, turning off transistor 65. The voltage on bit line 69' drops. When bit line 69' voltage is less than reference voltage REF, transistor 131' turns off and transistor 129', conducts all of the current from sink 99', discharging bit line 69' through high level current sink 99', thereby writing with a high level current. The write current shifts the memory state of memory cell 76 as described for the first preferred embodiment.

If memory cell 76 is already in the state corresponding to the data to be written, V2 will be high and V1 will be low at the beginning of the data write operation. Bit line 69' will be at a high voltage when memory cell 76 is selected, therefore when $\overline{RD}$ goes low, bit line 69' remains high because of the current through memory cell 76. Transistor 131' remains on, and high level current sink 99' is fed from bit line 68' through transistor 131'. Transistor 129' remains off, therefore memory cell 76 feeds only a low level write current.

Figure 3:
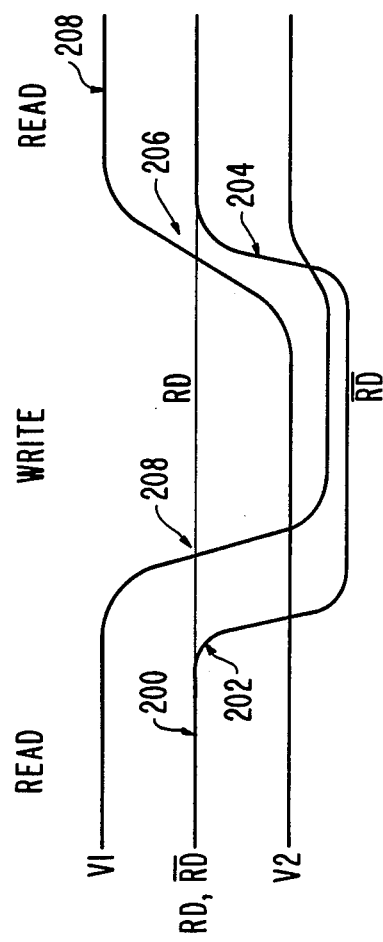
FIG. 3 is a timing diagram of the read and write signals of the random access memory of FIGS. 2 and 4.

After voltage V1 has dropped and V2 has started to rise, memory cell 76 has been shifted to a new memory state $\overline{RD}$ is brought back, at point 204 on the line representing $\overline{RD}$ of FIG. 3, to a voltage midway between V1 and the final state of V2.

As is apparent from the above discussion, a bipolar RAM incorporating the present invention will have faster read and write times resulting from selection of the read and write current magnitudes as a function of the state of the bipolar memory cell.

Additional advantages and modifications will readily occur to those skilled in the art. The invention in its broader aspect is, therefore, not limited to the specific details, representative apparatus and illustrative example shown and described. Accordingly, departures may be made from such details without departing from the spirit or scope of applicant's general inventive concept.

What is claimed is:

1. A bipolar random access memory, comprising:
   (a) at least one pair of bit lines;
   (b) at least one memory cell connected between said pair of bit lines, with each memory cell having a present memory state that is a first memory state representing a first data value or a second memory state representing a second data value;
   (c) means for selecting said at least one memory cell for a read operation or a write operation; and
   (d) means for writing data values to said at least one memory cell by shifting said present memory state using a first write current of a first magnitude when said data value does not correspond to said present memory state, and by not shifting said present memory state using a second write current having a lower magnitude than said first magnitude when said data value corresponds to said present memory state.

2. The bipolar random access memory of claim 1 further including a bit line deselect charging circuit for charging said bit lines to a preselected level following said read and write operations.

3. The bipolar random access memory of claim 1 wherein said at least one memory cell includes a high voltage side and a low voltage side corresponding to said present memory state; and
   said means for selecting including means for discharging a one of said bit lines connected to the low voltage side of said at least one memory cell.

4. The bipolar random access memory of claim 3 wherein said means for writing includes means for supplying a reference voltage higher than the voltage of a bit line connected to the low voltage side of said at least one memory cell but less than the voltage of a bit line connected to the high voltage side of said at least one memory cell.

5. The bipolar random access memory of claim 1 wherein said at least one memory cell comprises a high voltage side and a low voltage side corresponding to said present memory state; and
   said means for writing including means for supplying a reference voltage equal to the voltage of a one of said bit lines connected to the low voltage side of said at least one memory cell.

6. The bipolar random access memory of claim 1 wherein said means for writing includes means for terminating said first write current after said memory cell shifts said memory state.

7. A method of storing data in a random access memory having at least one bipolar memory cell coupled to a pair of bit lines, comprising:
   (a) selecting the at least one bipolar memory cell for a data read operation or a data write operation; and
   (b) writing data values to the at least one memory cell by shifting a present memory state using a first write current of a first magnitude when said data value does not correspond to said present memory state, and by not shifting said present memory state using a second write current when said data value corresponds to said present memory state, said second write current having a lower magnitude than said first magnitude.

8. The method of storing data of claim 7 further including charging the bit lines to a preselected level following said read and write operations using a bit line deselect charging circuit.

9. The method of storing data of claim 7 wherein said step of selecting includes discharging the one of said bit lines connected to a low voltage side of the at least one memory cell.

10. The method of storing data of claim 9 wherein said at least one memory cell includes a high voltage side and a low voltage side corresponding to said present memory state;
    said step of writing including supplying a reference voltage having a voltage level higher than the voltage of a one of said bit lines connected to the low voltage side of said at least one memory cell but less than the voltage of a one of said bit lines connected to the high voltage side of said at least one memory cell.

11. The method of storing data of claim 7 wherein said at least one memory cell comprises a high voltage side and a low voltage side corresponding to said present memory state; and
    said step of writing including supplying a reference voltage equal to the voltage of a bit line connected to the low voltage side of said at least one memory cell.

12. The method of storing data of claim 7 wherein said step of writing includes terminating said first write current after the memory cell shifts said memory state.

* * * * *